(12) United States Patent
Ishizaki et al.

(10) Patent No.: US 10,141,208 B2
(45) Date of Patent: Nov. 27, 2018

(54) VACUUM PROCESSING APPARATUS

(71) Applicant: CANON ANELVA CORPORATION, Kawasaki-shi, Kanagawa (JP)

(72) Inventors: Ryo Ishizaki, Kawasaki (JP); Daisuke Kobinata, Tokyo (JP); Naoki Kubota, Kawasaki (JP); Kyosuke Sugi

(73) Assignee: Canon Anelva Corporation, Kawasaki-shi, Kanagawa-ken (JP)

( * ) Notice: Subject to any disclaimer, the term of this patent is extended or adjusted under 35 U.S.C. 154(b) by 401 days.

(21) Appl. No.: 14/831,597

(22) Filed: Aug. 20, 2015

(65) Prior Publication Data
US 2015/0357214 A1   Dec. 10, 2015

Related U.S. Application Data

(63) Continuation of application No. PCT/JP2013/006138, filed on Oct. 16, 2013.

(30) Foreign Application Priority Data

Feb. 28, 2013   (JP) .................................. 2013-038111

(51) Int. Cl.
*H01L 21/67* (2006.01)
*C23C 14/22* (2006.01)
(Continued)

(52) U.S. Cl.
CPC ...... *H01L 21/67115* (2013.01); *C23C 14/225* (2013.01); *C23C 14/541* (2013.01);
(Continued)

(58) Field of Classification Search
CPC .................................................. H01L 21/67115
(Continued)

(56) References Cited

U.S. PATENT DOCUMENTS

2002/0139307 A1   10/2002   Ryding et al.
2005/0175952 A1*   8/2005   Toba ................. H01L 21/67109
                                                         432/241
(Continued)

FOREIGN PATENT DOCUMENTS

JP   59-84842   6/1984
JP   11-131230 A   5/1999
(Continued)

OTHER PUBLICATIONS

International Search Report (PCT/ISA/210) dated Nov. 19, 2013, by the Japanese Patent Office as the International Searching Authority for International Application No. PCT/JP2013/006138.

*Primary Examiner* — Karla A Moore
*Assistant Examiner* — Tiffany Z Nuckols
(74) *Attorney, Agent, or Firm* — Buchanan Ingersoll & Rooney PC

(57) ABSTRACT

A vacuum processing apparatus includes a tilting unit configured to tilt, in a vacuum vessel, a substrate holder including a refrigerator, and a rotary joint provided in the tilting unit and including a coolant path configured to supply or exhaust a coolant gas to or from the refrigerator. The rotary joint includes a fixed portion fixed to the vacuum vessel, a pivotal portion provided so as to pivot with respect to the fixed portion and fixed to the substrate holder, and a grease supply passage.

4 Claims, 3 Drawing Sheets

(51) Int. Cl.
*C23C 14/54* (2006.01)
*H01J 37/32* (2006.01)
*H01L 21/687* (2006.01)

(52) U.S. Cl.
CPC .. *H01J 37/32715* (2013.01); *H01J 37/32724* (2013.01); *H01L 21/6719* (2013.01); *H01L 21/67109* (2013.01); *H01L 21/68785* (2013.01); *H01L 21/68792* (2013.01)

(58) Field of Classification Search
USPC ................. 118/728–733; 156/345.51–345.55
See application file for complete search history.

(56) References Cited

U.S. PATENT DOCUMENTS

| | | | |
|---|---|---|---|
| 2007/0098889 A1 | 5/2007 | Nose et al. | |
| 2010/0155227 A1 | 6/2010 | Endo et al. | |
| 2011/0272278 A1* | 11/2011 | Sugi | C23C 14/225 |
| | | | 204/298.06 |
| 2013/0113169 A1* | 5/2013 | Sugi | H01L 21/6831 |
| | | | 279/128 |

FOREIGN PATENT DOCUMENTS

| | | | | |
|---|---|---|---|---|
| JP | 2004-536444 A | 12/2004 | | |
| JP | 2005-082837 A | 3/2005 | | |
| JP | 2011-149100 A | 8/2011 | | |
| JP | WO 2012011149 A1 * | 1/2012 | ......... | H01L 21/6831 |
| WO | WO 2010/073323 A1 | 7/2010 | | |

\* cited by examiner

VACUUM PROCESSING APPARATUS

This application is a continuation of International Patent Application No. PCT/JP2013/006138 filed on Oct. 16, 2013, and claims priority to Japanese Patent Application No. 2013-038111 filed on Feb. 28, 2013, which is incorporated by reference herein in its entirety.

BACKGROUND OF THE INVENTION

Field of the Invention

The present invention relates to a vacuum processing apparatus and, more particularly, to a vacuum processing apparatus capable of cooling a substrate held by a substrate holder tiltably provided in a vacuum vessel.

Description of the Related Art

There is known a deposition apparatus that cools, using a refrigerator, a substrate held by a substrate holder (for example, PTL 1). This deposition apparatus is configured to efficiently cool the substrate by arranging a GM-type refrigerator in the substrate holder. A compression device that exchanges helium gas with the refrigerator is arranged outside the vacuum vessel. The refrigerator and the compression device are connected by a hose that transfers the helium gas serving as a coolant.
PTL 1: Japanese Patent Laid-Open No. 2011-149100

SUMMARY OF THE INVENTION

In the technique of PTL 1, since the substrate holder incorporates the refrigerator, the refrigerator also needs to be tilted to tilt the substrate holder. However, since the hose connected to the refrigerator is susceptible to bending, a mechanism for suppressing the bending amount of the hose when tilting the refrigerator is necessary. However, to further reduce the size and cost of the apparatus, an apparatus capable of supplying helium to a tilting refrigerator by a simple structure has been demanded.

The present invention has been made in consideration of the above-described problem, and has as its object to provide a vacuum processing apparatus capable of supplying, by a simple structure, helium to a refrigerator that tilts in a vacuum vessel.

According to the present invention, there is provided a vacuum processing apparatus comprising: a vacuum vessel in which vacuum processing can be performed; a substrate holder capable of holding a substrate; a tilting unit capable of making the substrate holder pivot about a pivotal axis and tilting the substrate held by the substrate holder with respect to a process source provided in the vacuum vessel; a cooling device provided in the substrate holder and configured to act together with a compression device provided outside the vacuum vessel to cool the substrate held by the substrate holder; and a rotary joint provided in the tilting unit and including a supply path configured to supply a coolant gas from the compression device to the cooling device and an exhaust path configured to exhaust the coolant from the cooling device to the compression device, wherein the rotary joint comprises: a fixed portion fixed to the vacuum vessel; a pivotal portion provided so as to pivot with respect to the fixed portion and fixed to the substrate holder; and a gas guide path provided in one of the fixed portion and the pivotal portion and configured to guide the coolant gas that has leaked from one of the supply path and the exhaust path in a region where the fixed portion faces the pivotal portion to an outside of the rotary joint.

According to a vacuum processing apparatus of the present invention, it is possible to provide a vacuum processing apparatus capable of cooling a substrate held by a substrate holder that tilts in a vacuum vessel. In particular, since a substrate holder that cools a substrate using a GM-type refrigerator is provided, it is possible to sufficiently cool the substrate in a vacuum process or apparatus arrangement with relatively large heat inflow.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Embodiments of the present invention will now be described with reference to the accompanying drawings. It should be noted that members, arrangements, and the like to be described below are merely specific examples of the present invention and are not intended to limit the scope of the present invention, and various changes and modifications can be made within the spirit and scope of the present invention, as a matter of course. In each embodiment, a sputtering apparatus will be exemplified as a vacuum processing apparatus 1. However, the present invention is also applicable to another deposition apparatus or etching apparatus, as a matter of course. For example, when the present invention is applied to an etching apparatus, an ion beam source is used as a process source.

First Embodiment

Figure 1:
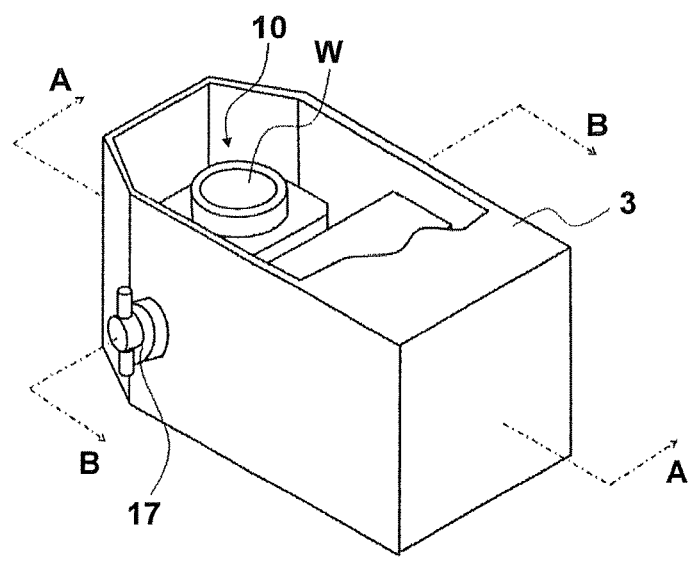
FIG. 1 is a schematic view of a vacuum processing apparatus according to the first embodiment of the present invention.
Figure 2:
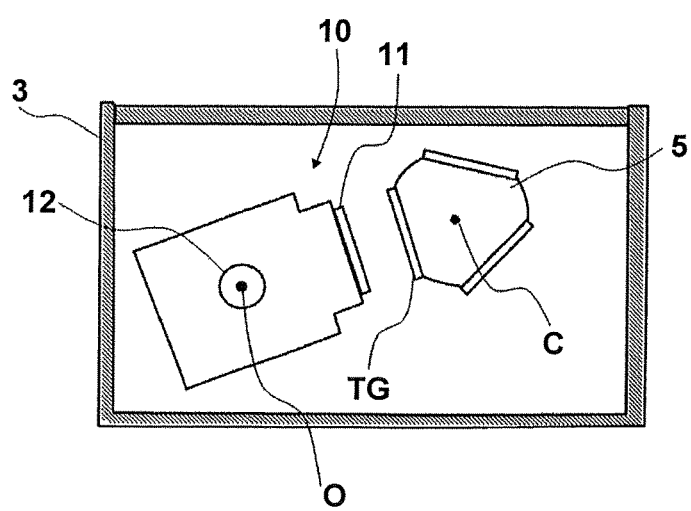
FIG. 2 is a sectional view taken along a line A-A in FIG. 1.
Figure 3:
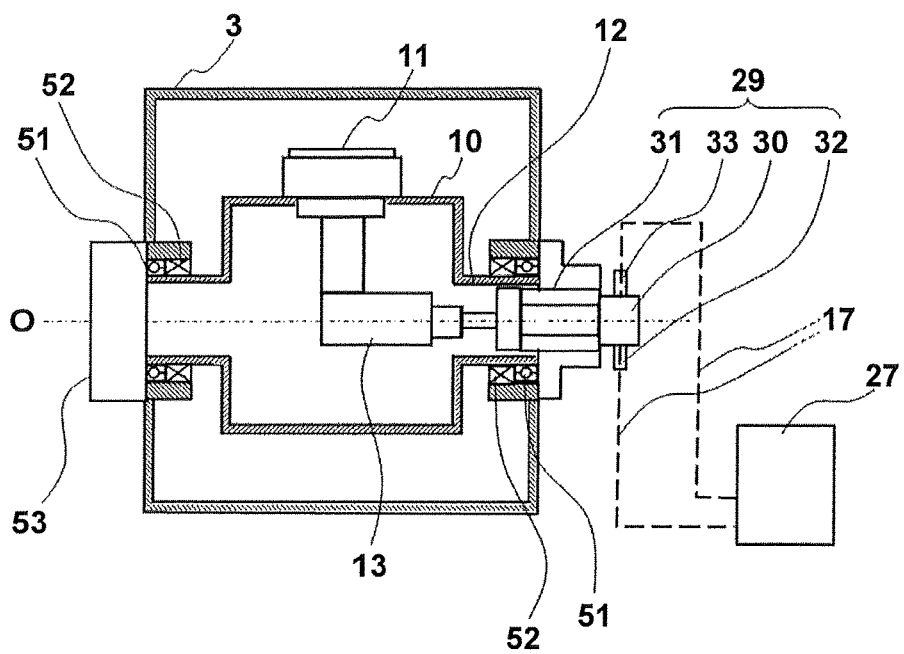
FIG. 3 is a sectional view taken along a line B-B in FIG. 1.
Figure 4:
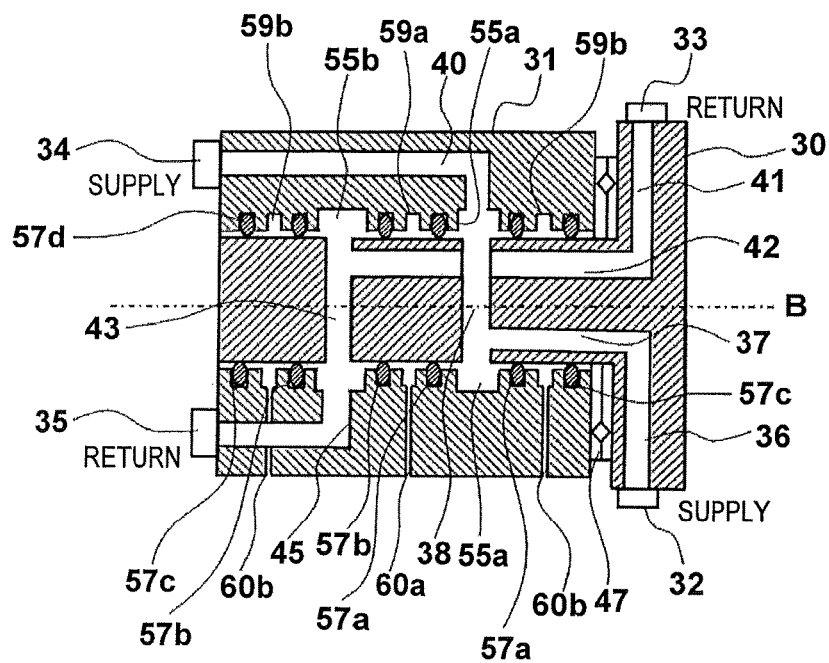
FIG. 4 is a schematic sectional view of a rotary joint used in the vacuum processing apparatus according to the first embodiment of the present invention.

A vacuum processing apparatus according to the first embodiment will be described with reference to FIGS. 1 to 4. FIG. 1 is a schematic view of a vacuum processing apparatus 1. FIG. 2 is a sectional view taken along a line A-A in FIG. 1 or a schematic sectional view of the central portion of the vacuum processing apparatus 1 taken along a plane perpendicular to a holder pivotal shaft O. FIG. 3 is a sectional view taken along a line B-B in FIG. 1 or a schematic sectional view of a substrate holder 10 taken along a plane in the direction of gravity parallel to the holder pivotal shaft O. FIG. 4 is a schematic sectional view of a rotary joint 29. Note that in FIG. 1, the wall is partially removed to show the interior of a vacuum vessel.

The vacuum processing apparatus 1 is a sputtering apparatus, and can change an angle (incidence angle) at which a deposited substance (process particles) sputtered from a target TG serving as a process source attached to a cathode 5 strikes a substrate W by making the substrate holder 10 pivot in a direction to tilt with respect to the cathode 5. The vacuum processing apparatus 1 includes the substrate holder 10 and the cathode 5 in a vacuum vessel 3.

The cathode 5 serving as a target holder is a rotary cathode that rotates about a cathode rotating shaft C as a rotating axis. Three targets TG are attached to the outer surface. One of the targets TG used for deposition can be selected by making it face the substrate holder 10. The cathode 5 incorporates a magnet that generates a magnetic field on the surface of the target TG. The selected target TG is sputtered by applying power from a power supply (not shown) to the target TG facing the substrate holder 10. It is also possible to change the relative angle of the target TG facing the substrate W held by the substrate holder 10 by rotating the cathode 5. Hence, the angle at which the deposited substance sputtered from the selected target TG strikes the substrate W can also be adjusted by rotating the cathode 5. Making the sputtered particles strike the substrate W at an angle is effective in uniforming the film thickness. A gas introduction device (not shown) for introducing a gas is provided around the cathode 5.

The substrate holder 10 includes a stage 11 (substrate stage) that holds the substrate W. The substrate holder 10 is configured to be made to pivot (tilt) about the holder pivotal shaft O (pivotal axis) by a tilting device serving as a tilting unit. The tilting device is a device that makes the substrate holder 10 pivot about the holder pivotal shaft O, and includes a pivotal member 12 that is connected to the substrate holder 10 and pivots with respect to the vacuum vessel 3. The substrate holder 10 and the pivotal member 12 hermetically seal their interiors. Even if a vacuum atmosphere is formed in the vacuum vessel 3, the substrate holder 10 can internally hold the atmospheric pressure.

In addition to the pivotal member 12, the tilting device (tilting unit) includes bearings 51 that support the pivotal member 12 in the vacuum vessel 3, sealing mechanisms 52 that seal the connection portions between the pivotal member 12 and the vacuum vessel 3, a driving source 53 that makes the pivotal member 12 pivot, a sensor (not shown) that detects the tilt angle of the substrate holder 10 by detecting the pivotal angle of the driving source, and a control device (not shown) that controls the driving source 53 based on a signal from the sensor and set values input in advance. In this embodiment, as the sealing mechanism 52, a magnetic seal using a magnetic fluid is used. The rotary joint 29 (to be described later) is connected to the pivotal member 12.

When the pivotal member 12 of the tilting device pivots, the substrate holder 10 fixed to the pivotal member 12 can be tilted to adjust the relative angle of the substrate W on the stage 11 facing the target TG. That is, the tilting device can adjust the relative angle (incidence angle) of sputtered particles that strike the substrate W from the target TG. The substrate holder 10 incorporates a refrigerator 13 serving as a cooling device that cools the stage 11.

The refrigerator 13 (cooling device) is a GM-type refrigerator. The GM-type refrigerator is a device that vertically drives a piston (displacer) in a cylinder containing a storage medium in the refrigerator to adiabatically expand helium gas, thereby cooling the stage to a very low temperature. In this embodiment, helium gas is used as the coolant gas. However, another gas may be used.

As schematically shown in FIG. 3, a compression device 27 is arranged outside the vacuum vessel 3. The refrigerator 13 is configured to act together with the compression device 27 to cool the substrate held by the substrate holder 10. That is, high-pressure helium gas (high-pressure coolant) supplied from the compression device 27 is expanded in the cylinder of the refrigerator 13, thereby cooling the substrate W via the stage 11 connected to the refrigerator 13. Low-pressure helium gas (low-pressure coolant) expanded in the refrigerator 13 is collected by the compression device 27 via an exhaust path. The collected low-pressure helium gas is compressed by the compression device 27 and sent to the refrigerator 13 again as high-pressure helium gas.

The refrigerator 13 and the compression device 27 are connected via the rotary joint 29 and a hose (transfer unit) 17 capable of transferring high-pressure helium gas. The hose 17 is formed from a supply hose that supplies the high-pressure helium gas from the compression device 27 to a supply port 32 of the rotary joint 29, and a collection hose that returns the helium gas from an exhaust port 33 of the rotary joint to the compression device 27.

As shown in FIG. 4, the rotary joint 29 includes a fixed portion 30 fixed on the side of the vacuum vessel 3, and a pivotal portion 31 that is fixed to the pivotal member 12 and pivots with respect to the fixed portion 30. The pivotal portion 31 of the rotary joint 29 pivots according to the substrate holder 10. The fixed portion 30 is a resin or metal member having an almost round bar shape, and has one end fixed to the vacuum vessel 3. The pivotal portion 31 is a resin or metal member having an almost annular shape. The pivotal portion 31 receives one end side of the fixed portion 30 and is attached so as to pivot with respect to the fixed portion 30.

The supply port 32 provided in the fixed portion 30 of the rotary joint 29 and a supply port 34 provided in the pivotal portion 31 communicate with each other independently of the pivotal angle of the pivotal portion 31 and form a supply path to supply the coolant gas from the compression device side to the cooling device side. Similarly, the exhaust port 33 provided in the fixed portion 30 of the rotary joint 29 and an exhaust port 35 provided in the pivotal portion 31 communicate with each other independently of the pivotal angle of the pivotal portion 31 and form an exhaust path to exhaust the coolant gas to collect it from the cooling device side to the compression device side.

The supply port 34 provided in the pivotal portion 31 of the rotary joint 29 communicates with a transfer port (not shown) communicating with the inside of the cylinder of the refrigerator 13. High-pressure helium gas is supplied from the transfer port into the cylinder of the refrigerator 13, and low-pressure helium gas expanded in the cylinder is exhausted from another transfer port to the outside of the refrigerator 13. The transfer port of the refrigerator 13 to exhaust the low-pressure helium gas communicates with the exhaust port 35 on the exhaust side, which is provided in the pivotal portion 31 of the rotary joint.

A region where the pivotal portion 31 of the rotary joint 29 faces the fixed portion 30 is provided with gas distribution grooves 55 (55a and 55b) through which helium flows, sealing grooves 57 (57a, 57b, and 57c) to provide O rings 57d (sealing members), and grease grooves 59 (59a and 59b) in which grease is retained. In this embodiment, the grooves are formed annularly on the side of the pivotal portion 31 so as to make a round in the circumferential direction of the fixed portion 30. However, the grooves may be formed in the fixed portion 30 or in both the fixed portion 30 and the pivotal portion 31.

As the gas distribution grooves 55, the gas supply groove 55a that supplies high-pressure helium from the compression device 27 and the gas exhaust groove 55b that returns the helium gas from the refrigerator 13 to the compression device 27 are provided. The sealing grooves 57 include the sealing grooves 57a provided on both sides of the gas distribution groove 55a of the supply path, the sealing grooves 57b provided on both sides of the gas exhaust groove 55b of the exhaust path, and the sealing grooves 57c provided on opposite sides of the gas distribution grooves 55a and 55b with respect to the grease grooves 59b (to be described later).

The O rings 57d are fitted in the sealing grooves 57c, thereby preventing the helium gas from leaking from the region where the pivotal portion 31 faces the fixed portion 30. The two O rings 57d (first sealing members) fitted in the sealing grooves 57a on both sides of the gas supply groove 55a prevent the high-pressure helium gas from leaking from the gas supply groove 55a. Similarly, the O rings 57d (second sealing members) fitted in the sealing grooves 57b on both sides of the gas exhaust groove 55b prevent the high-pressure helium gas from leaking from the gas exhaust groove 55b.

In addition, the O rings 57d are fitted in the sealing grooves (one-side grooves of the sealing grooves 57a and 57b) between the gas supply groove 55a and the gas exhaust groove 55b, thereby preventing the high-pressure helium gas flowing through the gas supply groove 55a from flowing into the gas exhaust groove 55b on the low pressure side. Note that in this embodiment, the region where the pivotal portion 31 faces the fixed portion 30 is the portion in which the inner surface of the annular portion of the fixed portion 30 faces the outer surface of the pivotal portion 31.

The grease grooves 59 (59a and 59b) are provided near the sealing grooves 57a and 57b to suppress wear of the O rings 57d, and have a structure for always filling the O rings 57d with grease. In addition, to prevent dust from entering the grease from the atmospheric side, the atmospheric-side sealing grooves 57c beside the grease grooves are also provided with the O rings 57d.

The high-pressure helium gas transferred from the compression device 27 enters the supply port 32 of the fixed portion 30 via the hose 17, and is exhausted from the supply port 34 of the pivotal portion 31 (supply path). The high-pressure helium gas exhausted from the supply port 34 is supplied to the refrigerator 13. On the other hand, low-pressure helium gas exhausted from the refrigerator 13 flows for the exhaust port 35 of the pivotal portion 31 and is exhausted from the exhaust port 33 of the fixed portion 30 (exhaust path). The low-pressure helium gas exhausted from the exhaust port 33 returns to the compression device 27 via the hose 17. The supply path and the exhaust path of the fixed portion 30 and the pivotal portion 31 are separated inside the rotary joint 29 so as to form a structure that prevents the helium gas from being exchanged between them.

More specifically, the fixed portion 30 includes the supply port 32 from the compression device 27, a passage 37 parallel to an axis B, and passages 36 and 38 perpendicular to the axis B. The supply port 32 and the passages 36, 37, and 38 communicate and form part of the supply path of the coolant gas. The fixed portion 30 also includes passages 41 and 43 perpendicular to the axis B, a passage 42 parallel to the axis B, and the exhaust port 33 to the compression device 27. The exhaust port 33 and the passages 41, 43, and 42 communicate and form part of the exhaust path of the coolant gas. Note that the axis B is the pivotal axis of the pivotal portion 31 and is arranged to overlap the shaft O in this embodiment.

The pivotal portion 31 includes, as part of the supply path of the coolant gas, the supply port 34, the gas supply groove 55a formed in the circumferential direction, and a passage 40 that connects the supply port 34 and the gas supply groove 55a. The pivotal portion 31 also includes, as part of the exhaust path of the coolant gas, the gas exhaust groove 55b formed in the circumferential direction, the exhaust port 35, and a passage 45 that connects the exhaust port 35 and the gas exhaust groove 55b.

The pivotal portion 31 has a housing shape. When the pivotal portion 31 and the fixed portion 30 are axially connected via a bearing 47, the gas supply groove 55a of the pivotal portion 31 in the rotation direction communicates with the passage 38 of the fixed portion 30 perpendicular to the axis B, and the gas exhaust groove 55b of the pivotal portion 31 in the rotation direction communicates with the passage 43 of the fixed portion 30 perpendicular to the axis B. The helium gas flowing from the supply port 32 of the fixed portion 30 is thus passed through the supply port 34 of the pivotal portion 31 and transferred to the refrigerator 13. In addition, the helium gas flowing from the exhaust port 35 of the pivotal portion 31 is transferred from the exhaust port 33 of the fixed portion 30 to the compression device 27.

The grease grooves 59 (59a and 59b) are grooves serving as grease pools used to supply grease to the O rings 57d and are provided in the pivotal portion 31 adjacently to the sealing grooves 57 with the O rings 57d arranged. The pivotal portion 31 is provided with grease supply passages 60 (60a and 60b) serving as grease supply ports for supplying grease to the grease grooves 59 (59a and 59b). The grease supply passages 60 are provided in the grease grooves 59, respectively. In this embodiment, since three grease grooves 59 are provided, three grease supply passages 60 are provided.

More specifically, the grease groove 59a is provided to supply grease to the two O rings 57d arranged in the sealing grooves 57a and 57b located between the gas supply groove 55a as part of the supply path and the gas exhaust groove 55b as part of the exhaust path. Hence, the grease groove 59a is provided in a space in contact with both O rings. The grease supply passage 60a communicates with the grease groove 59a. Similarly, to supply grease to the O rings 57d arranged between the sealing groove 57c and one of the sealing grooves 57a and between the sealing groove 57c and one of the sealing grooves 57b, the grease grooves 59b are provided in spaces in contact with both O rings. The grease supply passages 60b communicate with the grease grooves 59b. Note that the atmospheric pressure is attained on the outer surface of the pivotal portion 31 because it is located inside the pivotal member 12. That is, the atmospheric pressure is attained on both sides of each of the grease supply passages 60a and 60b.

As the time elapses, a contaminated gas emitted from the grease in the grease grooves 59 is emitted to the atmosphere via the grease supply passages 60. For this reason, the contaminated gas never flows into the gas supply groove 55a and the gas exhaust groove 55b. That is, the grease supply passages 60 (grease supply ports) according to this embodiment also serve as paths (gas guide paths) to emit the contaminated gas. In addition, since the pressure of helium gas flowing into the gas supply groove 55a and the gas exhaust groove 55b is higher than the pressure in the grease grooves 59, that is, the atmospheric pressure, the contaminated gas is never mixed with the helium gas. That is, it is possible to exhaust the contaminated gas generated from the grease via the grease supply passages 60 (gas guide paths) while supplying a proper amount of grease to the O rings 57d. Hence, the purity of the helium gas is maintained for a long period.

Furthermore, since the grease supply passage 60a serving as a gas guide path communicates between the gas supply groove 55a that distributes the high-pressure helium gas and the gas exhaust groove 55b that distributes the low-pressure helium gas, the helium gas that has leaked from the gas supply groove 55a never flows into the gas exhaust groove 55b. The helium gas that has leaked from the gas exhaust groove 55b never flows into the gas supply groove 55a, either, as a matter of course. This can prevent the contaminated gas generated from the grease from mixing with the helium gas. Similarly, the grease supply passage 60b serving as a gas guide path communicates between the gas supply groove 55a and the outside of the rotary joint 29 under the atmospheric pressure. In addition, the grease supply passage 60b serving as a gas guide path communicates between the gas exhaust groove 55b and the outside of the rotary joint 29 under the atmospheric pressure. For this reason, the helium gas never flows from the atmospheric pressure side to the gas supply groove 55a, and the contaminated gas generated from the grease can be prevented from mixing with the helium gas.

Since the grease supply passage 60 (gas guide path) for exhausting the contaminated gas prevents the contaminated gas from mixing with the helium gas, the reliability of the operation of the refrigerator 13 can be improved. That is, since the contaminated gas (impurity) never freezes at a cold portion in the refrigerator 13 and blocks the channel of the coolant gas, cooling performance does not lower due to a decrease in the flow rate of the coolant gas. In addition, since there is no fear of an operation failure or malfunction of the refrigerator 13 caused by a frozen impurity adhered to its movable components, the reliability of the refrigerator can be improved. Hence, the maintenance interval can be prolonged.

It is, of course, conceivable that an impurity, not only the gas generated from the grease, mixes with the coolant gas, flows into the refrigerator 13, and freezes at a portion of very low temperature caused by adiabatic expansion as the characteristic feature of the refrigerator 13. In this case, maintenance is needed because the channel of the coolant gas is blocked.

Note that in this embodiment, the contaminated gas is exhausted via the grease supply passages 60. However, gas guide paths dedicated to exhaust the contaminated gas may be provided in the pivotal portion 31 independently of the grease supply passages 60. In this case, small paths communicating with the grease grooves 59 are formed so as to extend through the pivotal portion 31.

In this embodiment, the gas guide paths also serve as the grease supply passages 60 and are provided in the pivotal portion 31. However, the gas guide paths may be provided in the fixed portion 30. When providing the gas guide paths in the fixed portion 30, the exhaust port for contaminated gas may be provided on the outer side of the vacuum vessel for the coolant gas that has leaked from the supply path or exhaust path. The contaminated gas collected from the exhaust port for contaminated gas can be regenerated as the coolant gas by a predetermined process.

Second Embodiment

Figure 5:
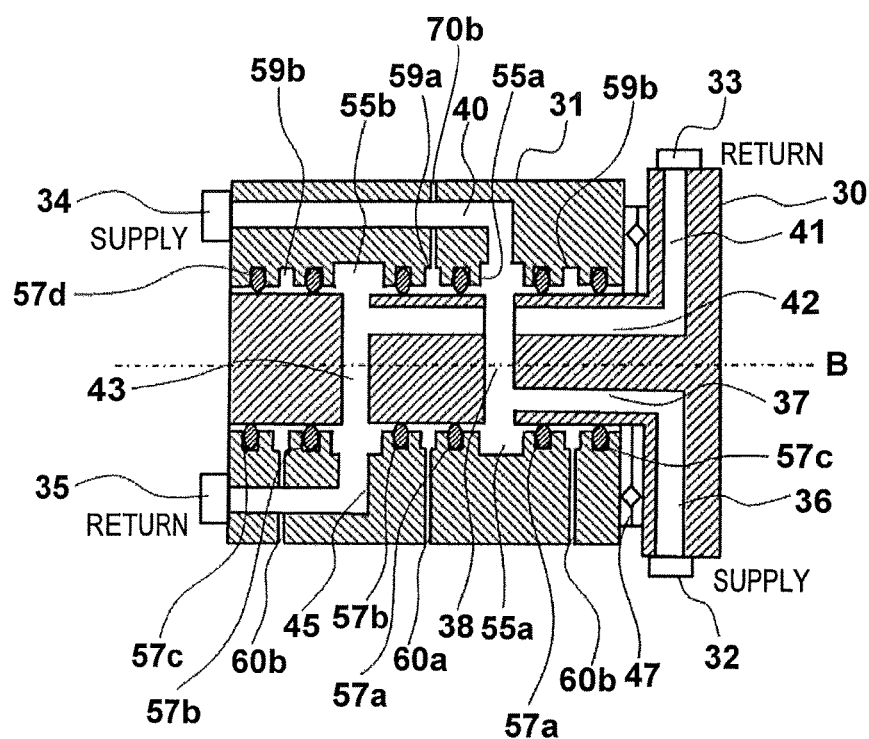
FIG. 5 is a schematic sectional view of a rotary joint used in a vacuum processing apparatus according to the second embodiment of the present invention.

In the first embodiment, each grease supply passage 60b also serves as a gas guide path. However, the grease supply passage 60b and the gas guide path may be formed from different paths. FIG. 5 is a schematic sectional view of a rotary joint used in a vacuum processing apparatus according to the second embodiment. In the arrangement shown in FIG. 5, a grease supply passage 60b serving as a grease supply port for supplying grease is provided in a pivotal portion 31. A gas guide path 70b serving as a path to emit gas is provided separately from the grease supply passage 60b.

As described above, according to the vacuum processing apparatuses of the first and second embodiments, it is possible to supply helium gas to the refrigerator tilting in the vacuum vessel by a simple structure. In addition, a path that communicates the atmospheric side with a grease groove for supplying grease to an O ring is formed. It is therefore possible to prevent an impurity from mixing with the coolant gas and improve the reliability of the refrigerator.

The present invention is not limited to the above embodiments, and various changes and modifications can be made within the spirit and scope of the present invention. Therefore, to apprise the public of the scope of the present invention, the following claims are made.

What is claimed is:

1. A vacuum processing apparatus comprising:
   a vacuum vessel in which vacuum processing can be performed;
   a substrate holder capable of holding a substrate;
   a tilting unit capable of making said substrate holder pivot about a pivotal axis and tilting the substrate held by said substrate holder with respect to a process source provided in said vacuum vessel;
   a cooling device provided in said substrate holder and configured to act together with a compression device provided outside said vacuum vessel to cool the substrate held by said substrate holder; and
   a rotary joint provided in said tilting unit and including a supply path configured to supply a coolant gas from said compression device to said cooling device and an exhaust path configured to exhaust the coolant from said cooling device to said compression device,
   wherein said rotary joint comprises:
   a fixed portion fixed to said vacuum vessel;
   a pivotal portion provided so as to pivot with respect to said fixed portion and fixed to said substrate holder; and
   a gas guide path provided in one of said fixed portion and said pivotal portion and configured to communicate a space region formed between the supply path and the exhaust path and guide the coolant gas that has leaked from one of the supply path and the exhaust path in the space region, where said fixed portion faces said pivotal portion and the supply path and the exhaust path are separated, to an outside of said rotary joint.

2. The vacuum processing apparatus according to claim 1, wherein said rotary joint further comprises:
   a first sealing member configured to seal the supply path; and
   a second sealing member configured to seal the exhaust path, and
   said gas guide path is connected to a space that is in contact with both said first sealing member and said second sealing member.

3. The vacuum processing apparatus according to claim 2, wherein said rotary joint further comprises a grease supply port connected to the space to supply grease to at least one of said first sealing member and said second sealing member.

4. The vacuum processing apparatus according to claim 3, wherein said grease supply port also serves as said gas guide path.

* * * * *